United States Patent
Yeh et al.

(10) Patent No.: US 10,755,790 B2
(45) Date of Patent: Aug. 25, 2020

(54) BOOSTED VOLTAGE DRIVER FOR BIT LINES AND OTHER CIRCUIT NODES

(71) Applicant: MACRONIX INTERNATIONAL CO., LTD., Hsinchu (TW)

(72) Inventors: Teng-Hao Yeh, Hsinchu (TW); Yi Ching Liu, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/254,933

(22) Filed: Jan. 23, 2019

(65) Prior Publication Data

US 2020/0234770 A1  Jul. 23, 2020

(51) Int. Cl.
| | |
|---|---|
| *G11C 16/06* | (2006.01) |
| *G11C 16/24* | (2006.01) |
| *H03K 19/20* | (2006.01) |
| *G11C 16/30* | (2006.01) |
| *G11C 16/04* | (2006.01) |
| G11C 11/56 | (2006.01) |

(52) U.S. Cl.
CPC .......... *G11C 16/24* (2013.01); *G11C 16/0483* (2013.01); *G11C 16/30* (2013.01); *H03K 19/20* (2013.01); *G11C 11/5621* (2013.01); *G11C 11/5671* (2013.01)

(58) Field of Classification Search
CPC ..... G11C 16/24; G11C 16/30; G11C 16/0483; G11C 11/5671; G11C 11/5621; G11C 7/1039; G11C 7/1051; G11C 7/1078; H03K 19/20
USPC .................................................... 365/185.17
See application file for complete search history.

(56) References Cited

U.S. PATENT DOCUMENTS

| | | | | |
|---|---|---|---|---|
| 6,049,494 A | * | 4/2000 | Sakui | G11C 16/10 365/203 |
| 7,016,230 B2 | * | 3/2006 | Hosono | G11C 16/26 365/185.17 |
| 9,887,011 B1 | | 2/2018 | Hung | |
| 2002/0126531 A1 | * | 9/2002 | Hosono | G11C 11/5621 365/185.17 |
| 2006/0285388 A1 | | 12/2006 | Ha et al. | |

(Continued)

OTHER PUBLICATIONS

EP Action in 19158629.6 dated Jun. 23, 2020, 6 pages.

*Primary Examiner* — Tha-O H Bui
(74) *Attorney, Agent, or Firm* — Haynes Beffel & Wolfeld LLP (57) ABSTRACT

A memory device is described with NAND strings and corresponding BL connected to SSL, a first power supply circuit, a second power supply circuit to distribute a higher supply voltage than the first power supply circuit, and a page buffer that generates program/inhibit outputs having a level between the first power supply voltage and a first reference voltage. Data line drivers drive nodes coupled to corresponding BL with a first voltage or a second voltage between the second power supply voltage and a second reference voltage. A data line driver includes a first switch transistor connected between the data line node and the second power supply circuit, a second switch transistor between the data line node and the second voltage reference, and a boost circuit to boost the gate of the first switch transistor above the first supply voltage level to turn on the first switch transistor.

16 Claims, 7 Drawing Sheets

(56) References Cited

U.S. PATENT DOCUMENTS

2016/0071606 A1\* 3/2016 Kodama ................ G11C 7/106
365/185.21

\* cited by examiner

FIG. 7 (not to scale)

BOOSTED VOLTAGE DRIVER FOR BIT LINES AND OTHER CIRCUIT NODES

BACKGROUND

Field of the Technology

The present disclosure relates to low voltage integrated circuits, such as page buffers for non-volatile memory, arranged to improve switching margins on select gates and other switching transistors.

Description of Related Art

NAND flash memory is widely adopted as a storage medium for mobile devices, solid-state disks in laptops and servers and for other data processing systems. As the data density on NAND flash memory chips has increased, page operations have become prevalent, in which large numbers of global bit lines are used in parallel for access to the memory cells of a page of data.

As CMOS technology advances, MOS devices require a smaller device area, operate at higher speeds and with lower power consumption, and utilize lower operation voltages. Channel length and channel width are becoming smaller, gate oxide (GOX) thickness is shrinking, and operating clock frequency is increasing.

In memory operations that access a page of data, charging of the bit lines can be required. For example, in a page programming algorithm, the bit lines that are coupled to the memory cells to be programmed in the page may be coupled to ground or another power supply terminal, while the bit lines that are coupled to memory cells that are not to be programmed may be left floating to inhibit programming by self-boosting of the unselected NAND string.

In both 2D and 3D NAND array operations, good on/off control of the select gate on the select string line (SSL) is important to self-boosting operations. In a representative NAND device, the threshold voltage for an SSL gate may range up to one volt, which is close to power supply levels in some low voltage technologies.

The maximum voltage that can be passed into the NAND string via an SSL gate is limited by the circuit operation voltage that is usually limited to the power supply levels. When shifting to more advanced CMOS technology, the SSL on/off operating margin therefore becomes narrower, with a smaller window of the strong off condition desired for the self-boosting operation, due to utilization of smaller device area and lower operation voltages.

It is desirable, therefore, to provide improved technology for enlarging the SSL on/off margin of array self-boosting operations, and for other settings requiring improved margin switching in low voltage integrated circuits.

SUMMARY

The disclosed technology includes a device comprising a first power supply circuit configured to be connected to a first power supply such as a low voltage external power supply, and to distribute a first power supply voltage, and a second power supply circuit configured to connect to a second power supply, such as an on-chip charge pump, the second power supply circuit configured to distribute a second power supply voltage higher than the first power supply circuit. Also included are a control circuit operably connected to the first power supply circuit to generate a first control signal having a voltage level between the first power supply voltage and a first reference voltage and a voltage driver connected to the second power supply circuit, to drive a circuit node with a first voltage or a second voltage having voltage levels between the second power supply voltage and a second reference voltage, in response to the first control signal. Further included is a boost circuit to boost the first control signal above the first power supply voltage level for supply to the voltage driver, so that a voltage higher than the first power supply voltage is applied to the output of the voltage driver.

In one disclosed embodiment, the circuit described infra includes a transistor having a first current-carrying node electrically connected to the circuit node driven by the voltage driver during an operation, a gate connected to a select line during the operation, and a second current-carrying terminal connected to a memory circuit, wherein the select line has a select line voltage higher than the first supply voltage during the operation. The first voltage is higher than the first supply voltage so that the transistor is turned off to block current flow to the memory circuit during the operation, and the second voltage is lower than the first supply voltage so that the transistor is turned on to conduct current to the memory circuit during the operation. As a result of the difference in magnitude of the first voltage and the second voltage, the switching margin for the transistor is improved.

A memory device is also described, comprising a plurality of bit lines and a plurality of NAND strings arranged for connection to corresponding bit lines in the plurality of bit lines. A NAND string in the plurality of NAND strings includes a select gate connected to a string select line, for connection of the NAND string to the corresponding bit line. A select gate driver connects to the string select line to supply a voltage higher than a first supply voltage. A first power supply circuit is configured to be connected to a first power supply to provide the first supply voltage and a second power supply circuit is configured to connect to a second power supply. The second power supply circuit is configured to distribute a second supply voltage higher than the first power supply circuit. A page buffer is connected to the first power supply circuit to generate program/inhibit signal outputs for corresponding bit lines in the plurality of bit lines, having a voltage level between the first power supply voltage and a first reference voltage. A plurality of data line drivers are connected to the second power supply circuit and to the page buffer, to drive data line nodes coupled to corresponding bit lines with a first bit line voltage or a second bit line voltage having voltage levels between the second power supply voltage and a second reference voltage, in response to the program/inhibit signal output from the page buffer. A data line driver in the plurality of data line drivers includes a first switch transistor connected between the data line node and the second power supply circuit, a second switch transistor between the data line node and the second voltage reference, and a boost circuit receiving the program/inhibit signal to boost the gate of the first switch transistor above the first supply voltage level to turn on the first switch transistor.

Other aspects and advantages of the present invention can be seen on review of the drawings, the detailed description and the claims, which follow.

BRIEF DESCRIPTION OF THE DRAWINGS

In the drawings, like reference characters generally refer to like parts throughout the different views. Also, the drawings are not necessarily to scale, with an emphasis instead generally being placed upon illustrating the principles of the technology disclosed. In the following description, various implementations of the technology disclosed are described with reference to the following drawings.

DETAILED DESCRIPTION

A detailed description of embodiments of the present invention is provided with reference to the FIGS. 1-7. Sample implementations are described to illustrate the technology disclosed, not to limit its scope, which is defined by the claims. Those of ordinary skill in the art will recognize a variety of equivalent variations on the description that follows.

The disclosed technology increases the select string line (SSL) on/off margin for NAND array self-boosting operation.

Figure 1:
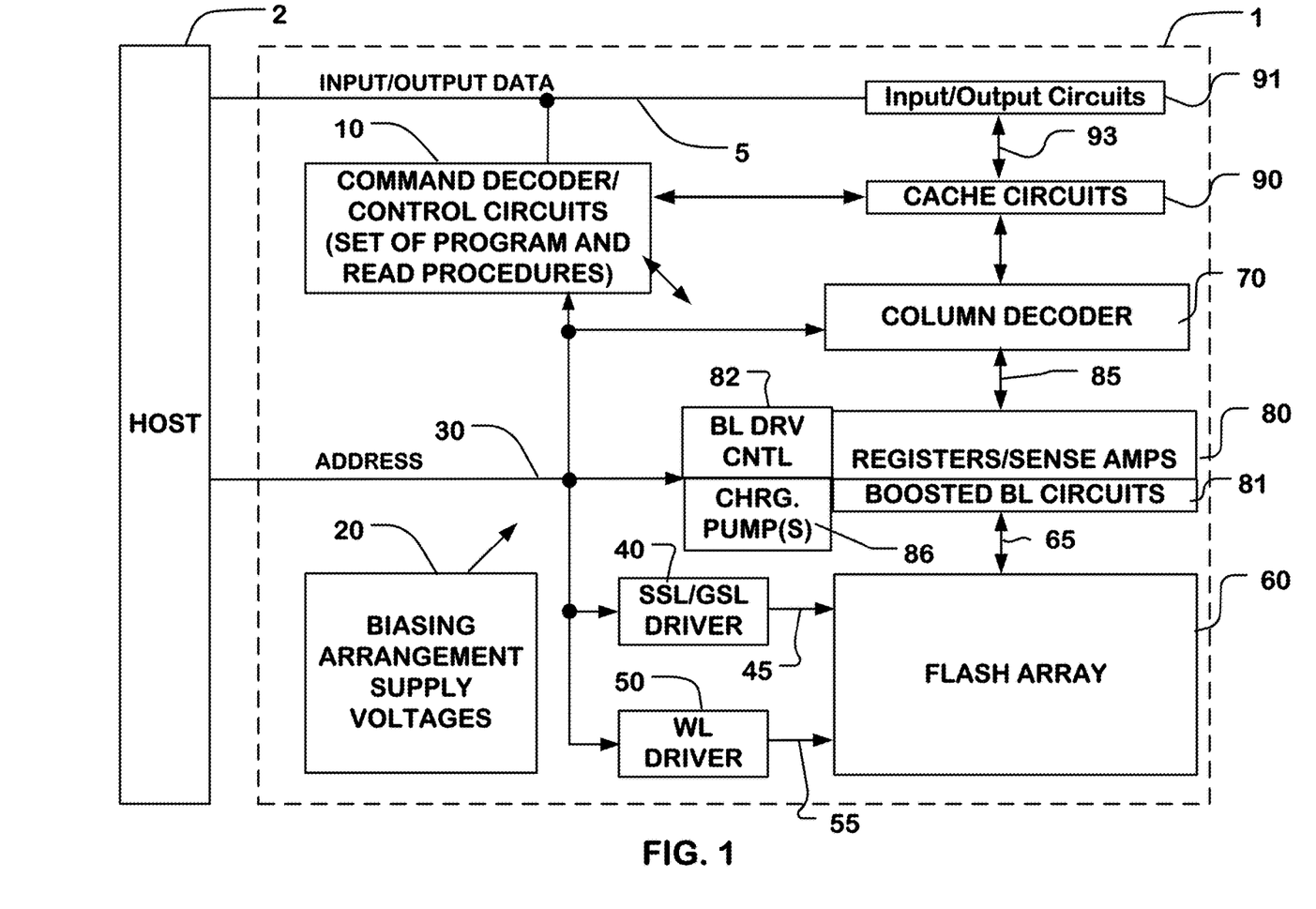
FIG. 1 is a simplified diagram of a memory system including a flash memory device implemented on an integrated circuit and a host according to one implementation of the technology disclosed.

FIG. 1 is a simplified diagram of a memory system including a flash memory device 1 implemented on an integrated circuit and a host 2 configured for page programming operations, including logic for page programming with bit line charge control circuits as described herein. The memory device can be implemented on a single integrated circuit chip, on a multichip module, or on a plurality of chips configured as suits a particular need.

The memory device 1 in this example includes a memory array 60 including single level cells or multiple-level cells MLC that store two or more bits of data per cell, on an integrated circuit substrate. Memory array 60 can be a NAND flash memory implemented using two-dimensional or three-dimensional array technology.

An SSL/GSL driver 40 is coupled to a plurality of bank select lines 55 (such as SSL lines and GSL lines). A word line (WL) driver 50 is coupled to a plurality of word lines 45, and arranged along rows in the memory array 60. A column decoder 70 can be coupled by bus 85 to a page buffer 80 including a set of registers and sense amplifiers. A bus including address lines 30 and data lines 5 is illustrated in this example. Addresses are supplied on address lines 30 to circuits 10 implementing a command decoder and controller modules, to column decoder 70, to SSL/GSL driver 40 and to word line (WL) driver 50. Also, addresses on lines 30 can be provided to the page buffer 80. In other examples, an input/output port may be used in which addresses and data may be provided on shared lines in an address/data bus. Also, serial interfaces may be deployed.

Page buffer circuits 80 including registers or latches and sense amplifiers are coupled to a plurality of bit lines 65 arranged along columns in the memory array 60 for reading data from and writing data to the memory array 60, in this example via first data lines 65. The page buffer circuits 80 can include registers or latches that store pages that establish a data pattern for programming, for memory cells in a block of cells arranged for page programming. The page buffer circuits 80 include boosted bit line circuits 81 as described herein, coupled with the bit lines in the memory array 60.

The page buffer circuits 80 can include circuits for selectively applying program and inhibit voltages to bit lines in the memory in response to the data pattern in the page buffer circuits 80 and control signals that set the program algorithm to be applied. As described herein, the bit line driver control circuit 82 operates to increase an operating margin on select gates in the memory by boosting bit line voltages on unselected bit lines during a program operation. Charge pump circuits 86, which can include one or more charge pumps, can be connected as the second power supply to the second power supply circuit, described later.

Bit lines for memory arrays can comprise global bit lines and local bit lines. Global bit lines generally comprise conductors in higher patterned layers that traverse a plurality of blocks of memory cells in an array, and connect to local bit lines in the blocks via block select transistors or bank select transistors. The local bit lines are connected to the memory cells for current flow to and from the global bit lines, which in turn are connected to the sensing circuits and page buffers.

In a read operation, sensed data from the page buffer circuits 80 are supplied via second data lines 85 to cache circuits 90, which are in turn coupled to input/output circuits 91 via data path lines 93. Also, input data is applied in this example to the cache circuits 90 on lines 93, and to the page buffer circuits 80 on lines 85, for use in support of program operations as described herein.

Input/output circuits 91 provide communication paths for the data with destinations external to the memory device 1. Input/output data and control signals are moved via data lines 5 between the input/output circuits 91, the control circuits 10 and input/output ports on the memory device 1 or other data sources internal or external to the memory device 1, such as a general purpose processor or special purpose application circuitry, or a combination of modules providing system-on-a-chip functionality supported by the memory array 60.

In the example shown in FIG. 1, control circuits 10 include control modules implementing a bias arrangement state machine, or machines, which controls, or control, the application of supply voltages generated or provided through the voltage supply or supplies in block 20, such as read, erase, verify and program voltages including precharge voltages, for a set of selectable program and read operations.

The control circuits 10 are coupled to the cache circuits 90 and the memory array 60 and other elements of the integrated circuit as needed.

The circuits 10 can include modules implemented using special-purpose logic circuitry including state machines, as known in the art. In alternative embodiments, the circuits 10 can include modules implemented using a general-purpose processor, which can be implemented on the same integrated circuit, which execute a computer program to control the operations of the memory device 1. In yet other embodiments, a combination of special-purpose logic circuitry and a general-purpose processor can be utilized for implementation of modules in circuits 10.

The flash memory array 60 can comprise floating gate memory cells or dielectric charge trapping memory cells. The technology can be used with single-bit-per-cell flash memory, and with other multiple-bit-per-cell and single-bit-per-cell memory technologies. In other examples, the memory cells may comprise programmable resistance memory cells, phase change memory cells, and other types of non-volatile and volatile memory cell technologies.

In the illustrated example, the host 2 is coupled to the address lines 30 and data lines 5 on the memory device 1, as well as other control terminals not shown, such as chip select terminals and so on, and can provide commands or instructions to the memory device 1. In some examples, the host 2 can be coupled to the memory device using a serial bus technology, using shared address and data lines. The host 2 can comprise a general purpose processor, a special purpose processor, a processor configured as a memory controller, or other processor that uses the memory device 1. All or part of the host 2 can be implemented on the same integrated circuit as the memory.

The host 2 can include a file system or file systems that store, retrieve, and update data stored in the memory based on requests from an application program. In general, the host 2 can include programs that perform memory management functions and other functions that can produce status information for data stored in the memory, including information marking data invalid as a result of such functions. Such functions can include for example wear leveling, bad block recovery, power loss recovery, garbage collection, error correction, and so on. Also, the host 2 can include application programs, file systems, flash translation layer programs and other components that can produce status information for data stored in the memory, including information marking data invalid as a result of such functions.

In high density memory, a page can comprise hundreds or thousands of bits, and a page buffer can be connected in parallel to the corresponding hundreds or thousands of bit lines. During program operations, for example, one set of bit lines is selected to be biased for programming a particular data pattern, and a different set of bit lines is selected to be biased to inhibit programming according to the particular data pattern.

Figure 2:
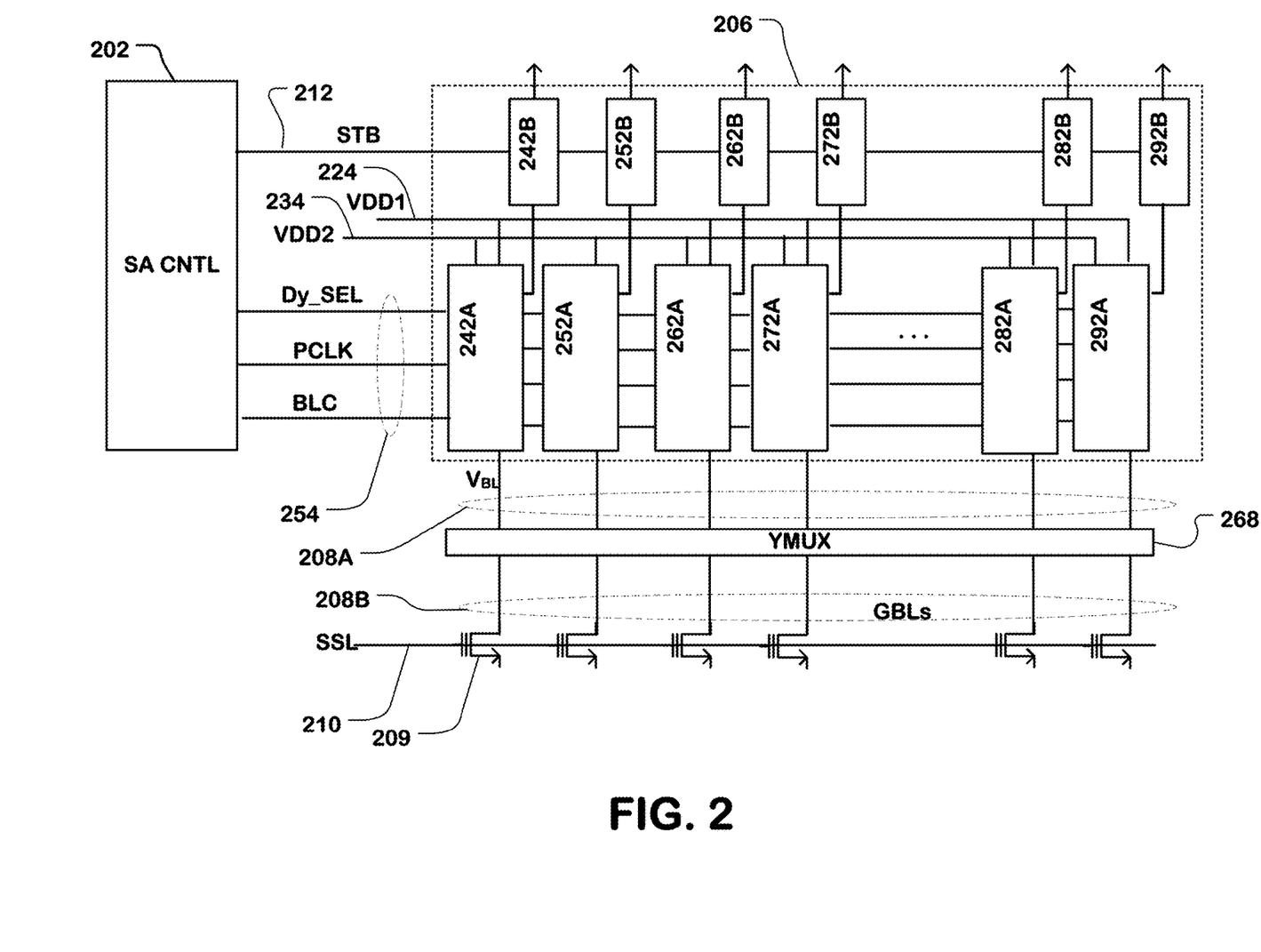
FIG. 2 is a simplified diagram of a page buffer configuration, including bit line circuits according to one implementation of the technology disclosed.

FIG. 2 is a simplified diagram of a plurality of bit line circuits 206 which can be used in a circuit like that of FIG. 1. The plurality of bit line circuits is coupled to a plurality of data lines 208A, which in some embodiments are coupled through a YMUX transistors (or hookup transistors) 268 for current flow communication with a plurality of bit lines 208B or other data line structure, where the bit lines can be global bit lines that are selectively connected to memory circuits, such as local bit lines according to decoding operations and the like in some implementations. The plurality of bit lines 208B are coupled according to the particular memory array architecture to memory cells arranged in NAND strings, which comprise series connected memory cells (not shown) and string select gates (e.g. 209). The string select gates (e.g. 209) of NAND strings in a section of the array are coupled to a string select line SSL 210, which can be shared by an entire page of memory cells. Sense amplifier control circuit 202 generates control signals and bias signals that are applied to bit line circuits in the plurality of bit line circuits 206 for the purposes of a variety of operations of the memory, the variety of operations including read and write operations, in some types of memory including flash memory, and erase operations, program operations and verify operations in support of program and erase.

In the embodiment represented by FIG. 2, bit line circuits in the plurality of bit line circuits 206 include respective driver modules 242A, 252A, 262A, 272A, . . . 282A, 292A and sense modules 242B, 252B, 262B, 272B, . . . 282B, 292B. The sense modules include respective sense nodes at which a voltage is developed during a sensing operation in response to the word line voltage applied to the selected cells on the corresponding bit lines, and generate a data signal in response to the voltage on the sense nodes that is applied for example to a latch or other data storage element in a page buffer. The driver modules includes a voltage driver connected to the second power supply circuit, to drive a circuit node with a first voltage or a second voltage having voltage levels between the second power supply voltage and a second reference voltage in response to the first control signal output; and a boost circuit to boost the first control signal above the first power supply voltage level for supply to the voltage driver. In this manner, the voltage on the circuit node can be close to the second power supply voltage.

The sense amplifier control circuit 202 includes a bit line driver control circuit, and applies a first set of control signals (BLC, PCLK, Dy_SEL) 254 to the driver modules and a second set of control signals (STB) 212 to the sense modules. Operation of the control signals is described below.

In an embodiment described herein, a memory device with many bit lines and NAND strings arranged for connection to corresponding bit lines includes a select gate selected to a string select line (SSL) 210 for connection of the NAND string to the corresponding bit line. A select gate driver is connected to the string select line (SSL) 210. The select gate on the NAND string can comprise a standard MOS transistor. In the illustrated embodiment, the select gate is implemented using a memory cell, operated as a select gate. In embodiments using the memory cell, the threshold voltage of the select gate can be in a range as high as 1 volt or more. With a supply voltage of 1.8 V, the operating margin of the select gate is therefore quite narrow. For program operations, however, it is important to turn off the select gate strongly to support self-boosting inhibit operations, for example. When the select gate is not strongly turned off, charge can leak, and program disturbance of unselected NAND strings can result.

As illustrated in FIG. 2, a first supply voltage VDD1 is supplied on line 224 to the driver circuits 242A-292A. A second supply voltage VDD2 is supplied on line 234 to the driver circuits 242A-292A.

Figure 3:
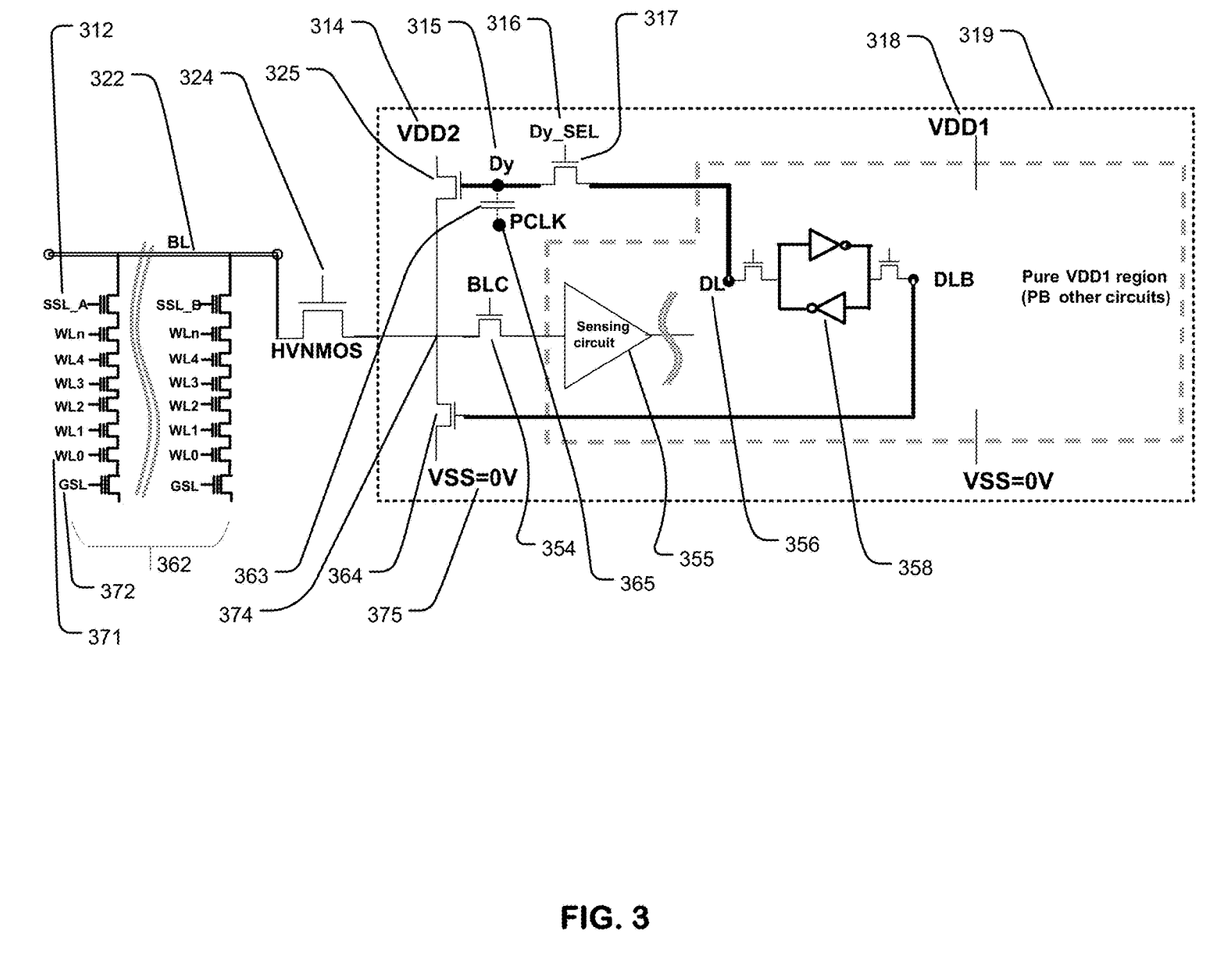
FIG. 3 illustrates a sense module for a memory device that includes the disclosed high bias boost circuit according to one implementation of the technology disclosed.

FIG. 3 illustrates a bit line driver module and a sense module, for a memory device according to one embodiment of the technology described herein, suitable for use in the system of FIG. 2. The memory device includes a first power supply circuit configured to be connected to first supply voltage level VDD1 318 and a second power supply circuit configured to connect to a second power supply circuit VDD2 314. In some embodiments, the first power supply circuit includes a conductor configured to be connected to an external power supply, such as by including an input/output pad, or other connection structure on the device. The second power supply circuit is configured to distribute a higher supply voltage than the first power supply circuit. In some embodiments, a charge pump circuit is connected as the second power supply to the second power supply circuit.

The memory includes a plurality of NAND strings 362 arranged for connection to corresponding word lines 371. Each NAND string includes a ground select gate coupled with a ground select line 372 and a string select gate coupled with a string select line 312, for connection of the NAND string to the corresponding bit line 322. A high voltage transistor HVNMOS 324 which can pass voltages larger than first supply voltage level VDD1 318 without breaking down is connected between the bit line 322 and a data line connected to driver node 374, and operated to isolate page buffer circuits from high voltage in some operations, such as block or sector erase operations. Page buffer circuit 319 is connected to the first power supply circuit, and can comprise logic gates configured for operation at lower voltages. In a program operation, the page buffer circuit 319 generates program/inhibit signal outputs for corresponding bit lines 322, according to a data pattern to be programmed. FIG. 3 illustrates part of a page buffer circuit 319 configured to drive a single bit line 322. The memory device will have a page buffer configured to drive a large number of bit lines in parallel according to the data pattern stored in the page buffer. In this simplified example, a latch 358 in the page buffer stores a bit represented in the data pattern to be stored in the corresponding cell in the memory. The latch provides a first output DL, and a second output DLB which is a complement of the first output DL. In a programming operation, the outputs DL and DLB can be used as program/inhibit signals for controlling corresponding bit lines according to the data pattern.

A sensing circuit 355 is coupled to the node 374 via a bit line clamp transistor 354. During a program operation, the bit line clamp transistor 354 can isolate the sensing circuit 355 from the data line. During a read operation, the sensing circuit 355 generates data values for output from the memory.

The page buffer comprises a plurality of transistors in a low voltage power domain on the chip configured for operation with the first supply voltage level VDD1 318. A voltage driver is connected to the second power supply circuit and to the latch 358 in the page buffer. The data line driver is responsive to the program/inhibit signals to drive a program voltage or an inhibit voltage to the node 374, which is transferred via transistor 324 to the bit line 322. In this example, the program voltage is VSS, which can be set to 0 V, delivered via second switch transistor 364. Also in this example, the inhibit voltage is a voltage greater than VDD1, and preferably close to VDD2, delivered via first switch transistor 325.

A driver circuit in this example includes a first switch transistor 325 connected between the data line node 374 and the second power supply circuit VDD2 314. In one embodiment of the technology, first switch transistor 325 is an NMOS transistor, configured for operation at voltages above VDD1, and at least as high as VDD2. A second switch transistor 364 is between the data line node 374 and the second voltage reference 375 (such as ground or 0 V), configured for operation at voltages above VDD1, and at least as high as VDD2. Both the first and second switch transistors 325, 364 are implemented using NMOS transistors.

Second power supply circuit VDD2 314 is powered by charge pump circuitry power source in one embodiment. In another case, the second power supply circuit includes a conductor configured to be connected to a second external power supply, or to a different kind of power source.

Continuing with the description of FIG. 3, a boost circuit is coupled to the gate of first switch transistor 325, to provide a high voltage to strongly turn on first switch transistor 325 with a gate voltage higher than VDD1, when the program/inhibit voltage on the output DL is logically high but less than VDD1. The boost circuit includes pass gate clamping MOS 317, configured as a pass gate and clamping transistor, between page buffer data latch 356 output DL and a node Dy 315 at the gate of first switch transistor 325. The gate of pass gate clamping MOS 317 is driven by the timing control signal Dy_SEL. The boost circuit also includes capacitor 363 that has first terminal connected to the gate node Dy of first switch transistor 325 and second terminal 365 connected to a timing control signal PCLK. Control logic (not shown) generates a first timing control signal Dy_SEL 316 on the gate of pass gate clamping MOS 317, and second timing signal PCLK on the second terminal 365 of capacitor 363.

In operation, the control logic generates the first timing control signal Dy_SEL and the second timing control signal PCLK in coordination with a programming operation when the latch 358 indicates an inhibit state for the corresponding bit line, to boost the gate node Dy above the first supply voltage level VDD1 318, strongly turning on first switch transistor 325 to transfer the higher power supply voltage VDD2 to the node 374. This can be accomplished by transferring the voltage at page buffer data latch 356 node, which is close to VDD1, via pass gate clamping MOS 317 to the gate node Dy, turning off the pass gate clamping MOS 317 to isolate node Dy, and boosting node Dy using the capacitive boosting in response to the second timing signal PCLK. This results in the voltage at node Dy being boosted to a level above VDD1 in order to strongly turn on first switch transistor 325. In a programming operation when the latch 358 indicates a programmed state for the corresponding bit line, according to the same set of timing signals, the pass gate clamping MOS 317 does not turn off, and the voltage at node DL is set to VSS, such as ground. In this condition, the node Dy quickly discharges to VSS after the capacitive boost from PCLK, and prevents coupling VDD2 to the node 374. In this case, second switch transistor 364 is turned on by the voltage on DLB, coupling node 374 to VSS.

For some embodiments, the control circuit comprises a plurality of transistors configured for operation with first supply voltage level VDD1 318. The voltage driver and boost circuit comprise transistors configured for operation with second power supply circuit VDD2 314.

Figures 4, 4A:
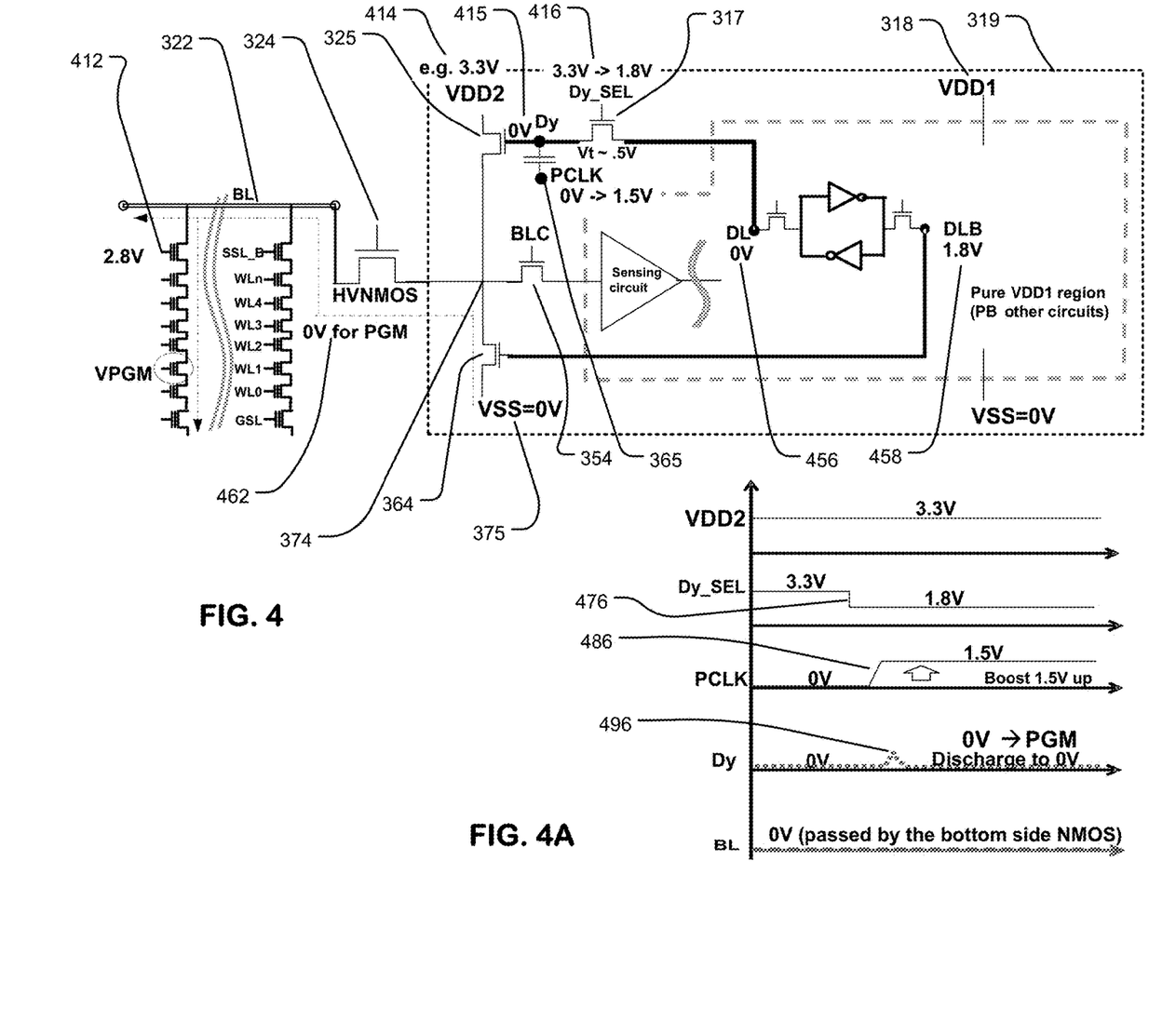
FIG. 4 illustrates circuit operation in programming mode for the sense module described relative to FIG. 3.
FIG. 4A shows a timing diagram for the circuit illustrated in FIG. 4.

FIGS. 4 and 4A illustrate operation of the circuit when the data latch indicates a programming state. In FIG. 4, voltage levels are labeled in the circuit diagram, and FIG. 4A shows a timing diagram.

As can be seen in the timing diagram, the second power supply voltage VDD2 is 3.3 V, and the data latch output for a programming state includes DL=0 V 456 and DLB=1.8 V 458. During an initial part of the program operation, DY_SEL is set to 3.3 V 414, connecting the node Dy to the node DL. As a result, Dy is set as 0 V 415 because the pass gate clamping MOS 317 is turned on during this operation. At time 476, the timing signal Dy_SEL is dropped to about 1.8 V 416, which is about the same level as the output DLB of the latch. The timing signal PCLK transitions from 0 V to about 1.5 V 486. This transition tends to capacitively boost the node Dy, as indicated by the glitch on the trace of the node Dy 496 in FIG. 4A. However, the node Dy quickly discharges to VSS via pass gate clamping MOS 317. The voltage of the Dy node cannot be coupled up due to the discharge path. Thus, the controlled NMOS first switch transistor 325 is kept off. Second switch transistor 364 is turned on connecting VSS to the BL (0 V) for programming.

Utilizing the circuitry described herein, the driver for the SSL line 412 can provide a relatively high voltage, such as 2.8 V. As a result, the SSL gate is strongly turned on, coupling the VSS voltage to the NAND string. A selected word line receives the program pulse, and the selected memory cell is programmed.

Figures 5, 5A:
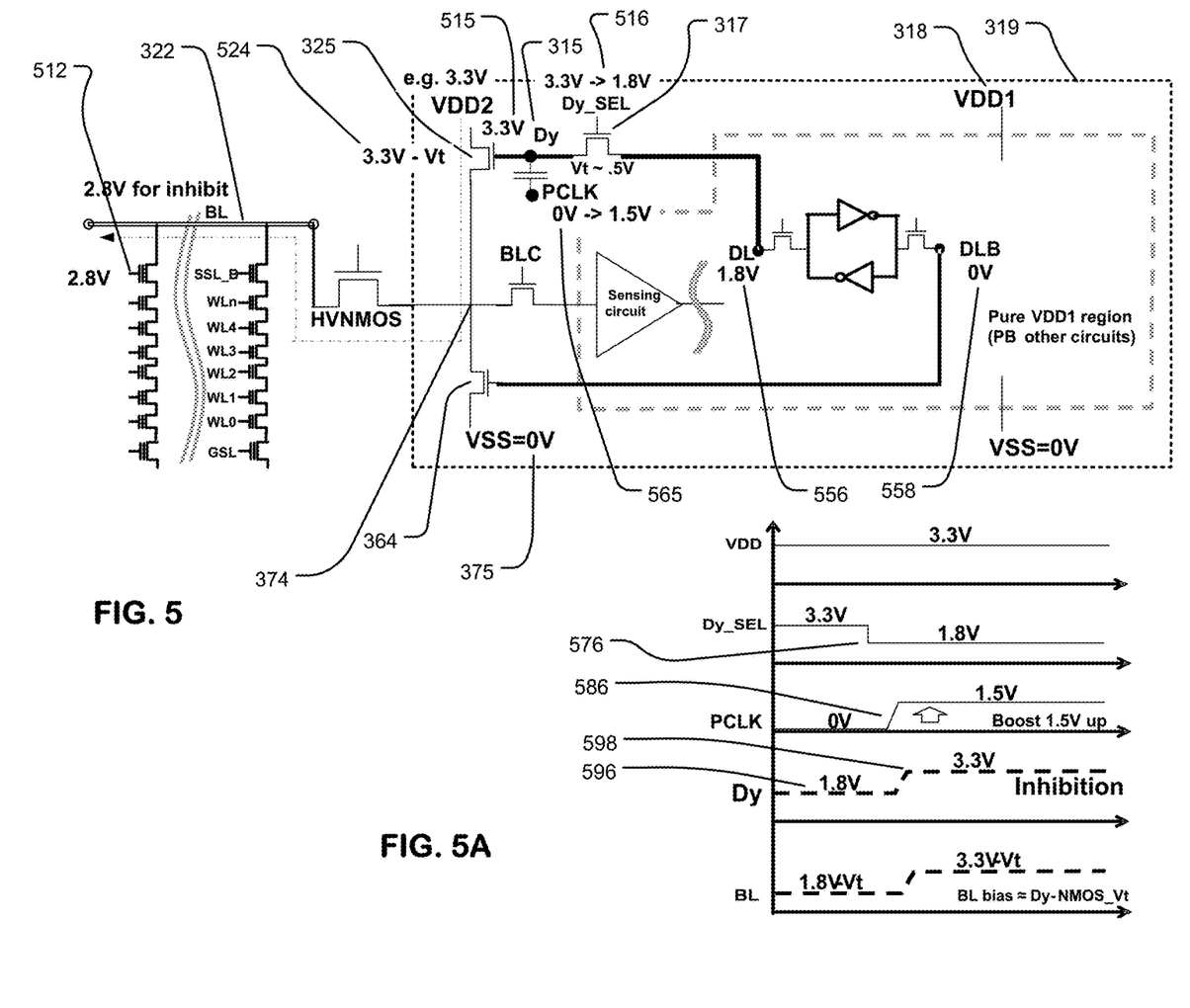
FIG. 5 illustrates circuit operation in inhibit mode for the sense module described relative to FIG. 3.
FIG. 5A shows a timing diagram for the circuit illustrated in FIG. 5.

FIG. 5 and FIG. 5A illustrate operation of the circuit when the data latch indicates an inhibit state. In FIG. 5, voltage levels are labeled in the circuit diagram, and FIG. 5A shows a timing diagram. In the inhibit state, the data latch outputs include DL=1.8 V 556 and DLB=0 V 558. As a result of the output DLB being 0 V, the bottom side NMOS second switch transistor 364 is turned off. For the inhibit state, the NMOS first switch transistor 325 is to be turned on by the boost circuit, in response to the same timing signals used in the program state, as can be seen in FIG. 5A. During an initial part of the program operation, DY_SEL is set to 3.3 V, connecting the node Dy 315 to the node DL. As a result, Dy is set as 1.8 V 596 because the pass gate clamping MOS 317 is turned on during this operation. This causes the node 374, and the bit line 322 to charge to a voltage of about (1.8-Vt), where Vt is the threshold of first switch transistor 325. At time 576, the timing signal Dy_SEL is dropped to about 1.8 V 516, which is about the same level as the output DL of the latch, causing pass gate clamping MOS 317 to turn off. At time 586, the timing signal PCLK transitions from 0 V to about 1.5 V 565. This transition tends to capacitively boost the node Dy to about 3.3 V 598. Therefore, the node Dy 315 holds the boosted voltage of about 3.3 V 515. This causes the node 374, and the corresponding bit line to charge to a level of about equal to the voltage on node Dy less the threshold of first switch transistor 325 (e.g., 3.3-Vt 524). With the bit line voltage at about 2.8 V, and the SSL line 512 set at about the same level, the SSL gate is strongly turned off, causing the selected NAND string to float. Thus, during the program operation, the inhibit bias caused by self-boosting is accomplished.

Figure 6A:
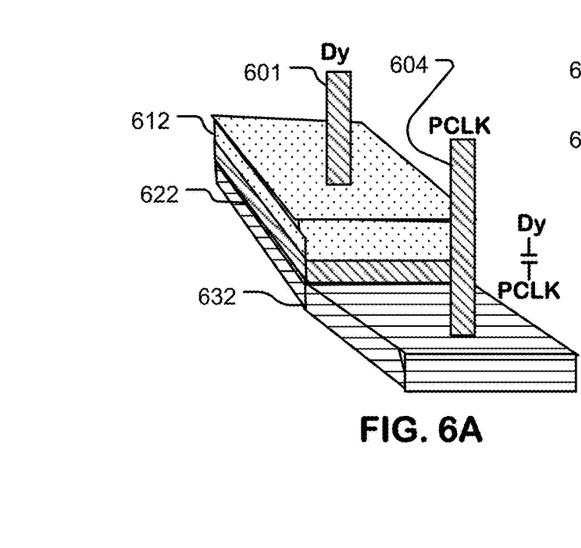
FIGS. 6A, 6B, 6C, 6D, 6E illustrate alternative capacitor structures for the boost circuit shown in FIG. 3.
Figure 6B:
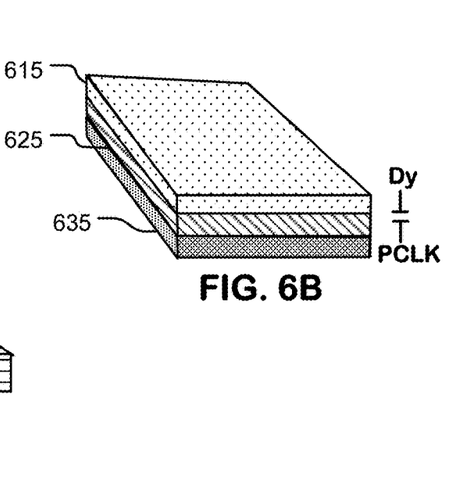
Figure 6C:
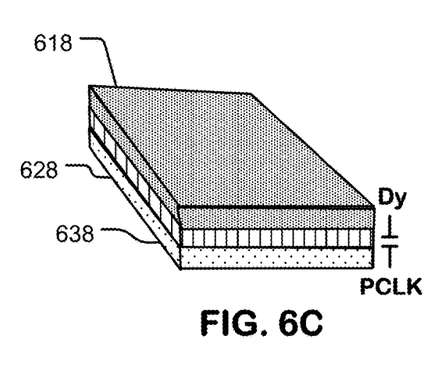
Figure 6D:
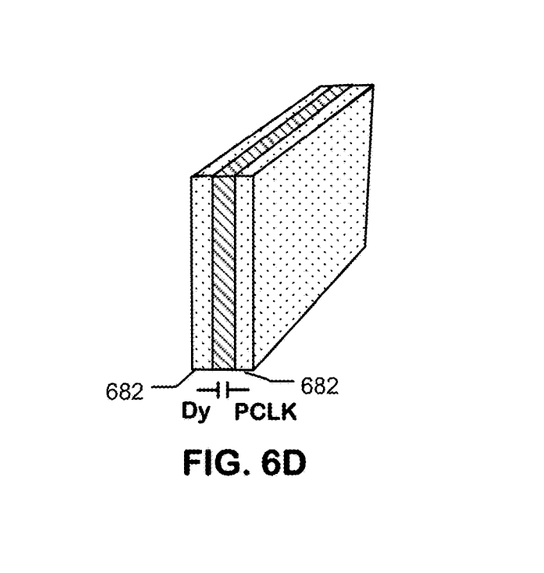
Figure 6E:
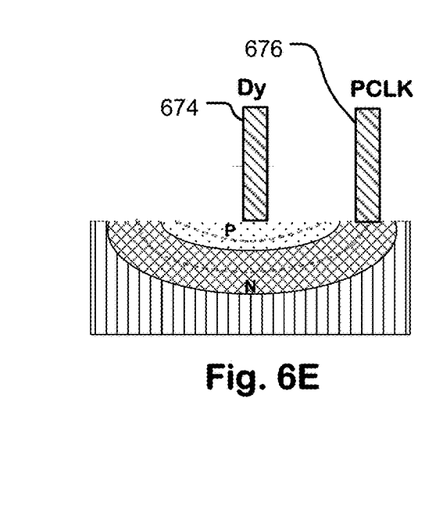

FIG. 6A through FIG. 6E illustrate alternative structures for capacitor 363 for the high bias boost circuit shown in FIG. 3, according to various embodiments of the technology described herein. FIG. 6A shows a metal oxide semiconductor (MOS) capacitor with Dy terminal 601 through gate 612 with GOX layer 622 and substrate 632 for PCLK terminal 604. FIG. 6B illustrates an alternative metal-insulator-metal (MIM) capacitor structure with metal one 615, inter-layer dielectric 625 and silicide or poly-Si base 635. FIG. 6C illustrates a third alternative: metal-insulator-metal (MIM) capacitor with base metal one 638 for PCLK terminal, inter-metal dielectric (IMD) 628 and metal two 618 for the Dy terminal for capacitor 363. FIG. 6D shows a fourth option for structure of capacitor 363, with metal-insulator-metal, in which the metals are the same metal material 682, with inter-metal dielectric sandwiched between. The capacitor can alternatively be any form of parasitic capacitor, also referred to as a junction capacitor, as modeled in FIG. 6E, with Dy node 674 and PCLK node 676.

The control circuit illustrated in FIG. 3 comprises a plurality of transistors configured for operation using the first power supply voltage VDD1 (e.g. 1.8 V) by for example having a first gate dielectric thickness, and the voltage driver and the boost circuit comprise transistors configured for operation using the second power supply voltage VDD2 (e.g. 3.3 V) by for example having a second gate dielectric thickness greater than the first gate dielectric thickness. The respective gate dielectric thicknesses include variations within manufacturing tolerances. The second power supply circuit VDD2 314 device can have a voltage of 3.3 volts, with a GOX layer thickness of 40 to 80 Å, and PL gate length of 0.2 um and channel width of 0.24 um, in one embodiment. First supply voltage level VDD1 318 device can have a voltage of 1.8 volts, with a GOX thickness of only 20 to 30 Å, and a PL gate length of 0.15 um, and a channel width of 0.18 um, in one embodiment.

Figure 7:
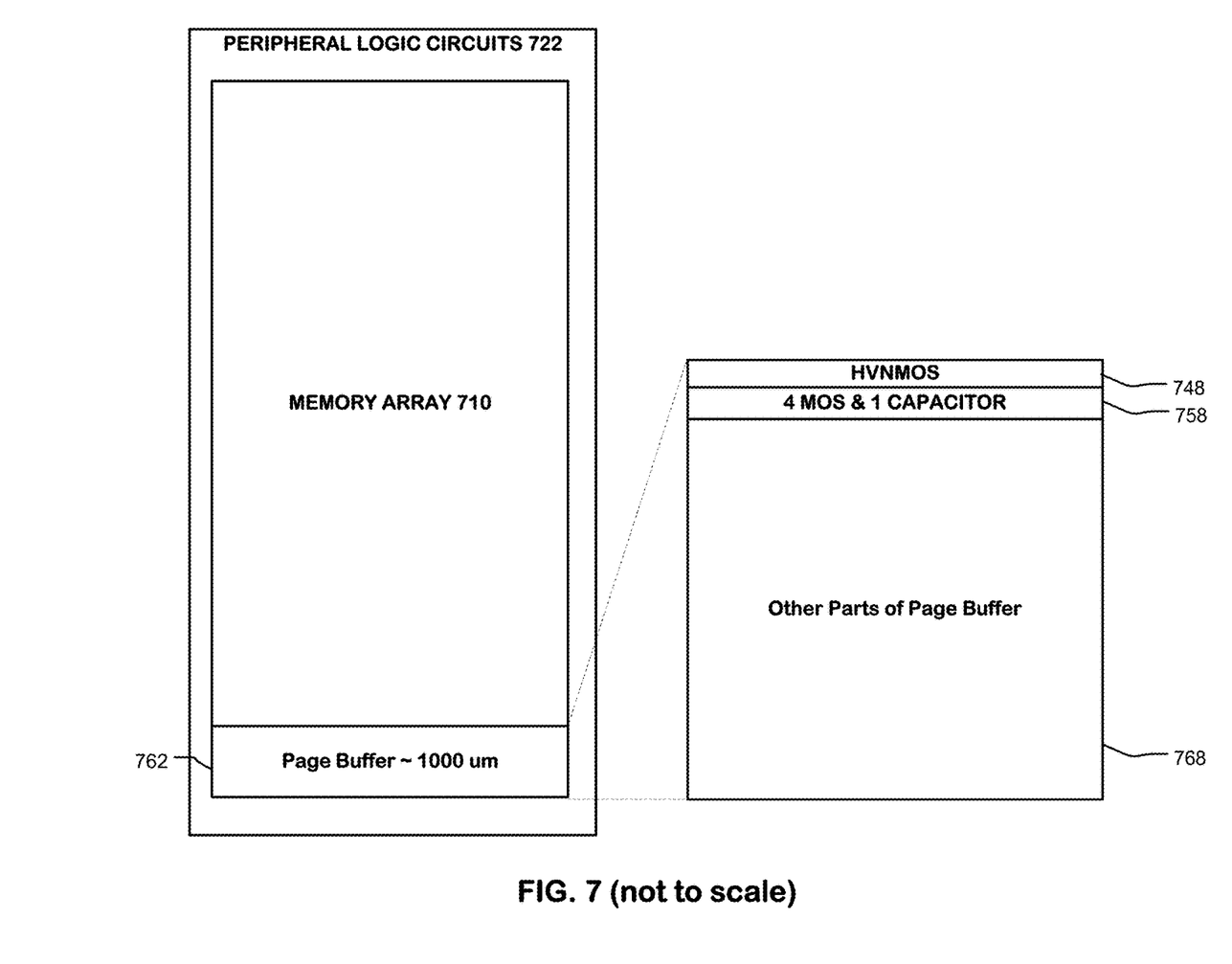
FIG. 7 illustrates a simplified layout view of an integrated circuit memory with a memory array domain, a low voltage peripheral domain, and a high voltage peripheral domain, including data line drivers as described herein.

FIG. 7 illustrates a layout of an integrated circuit memory device, including a memory array region 710, peripheral logic circuit region 722, and a page buffer region 762. Example page buffer region 762 can comprise an area of approximately 1000 square microns. The memory array region 710 comprises memory cells, manufactured according to a manufacturing technique unique to the particular memory cells used. The page buffer region 762 and the peripheral logic circuit region 722 are manufactured using logic cells, according to a manufacturing technique unique to logic circuits. The logic circuits on the device include low-voltage circuits configured for a power domain coupled to VDD1, and higher voltage circuits configured for a power domain coupled to VDD2. In this example low-voltage circuits can comprise a plurality of transistors having a first gate dielectric thickness 768. Higher voltage circuits can comprise transistors having a second gate dielectric thickness greater than the first dielectric thickness, and other features that are configured for operation in the power domain for VDD2. In FIG. 7, the page buffer is expanded to show the higher power domain region 748 including the HVNMOS column select gates and the higher power domain 758 including the driver circuit and boost circuit (4 NMOS transistors and 1 capacitor for each bit line to be driven in a page program operation). Thus, the first switch transistor 325 and second switch transistor 364 and the boost circuit comprise transistors having a second gate dielectric thickness greater than the first gate dielectric thickness. This gate dielectric thickness includes variations within manufacturing tolerances. In one embodiment, the high-voltage power domain switch transistors and capacitor 363 utilize a larger dimension design rule of greater than 0.2 um tech node and thicker gate oxide layer of 40 Å to 80 Å for allowing a higher voltage path, enabling changed operation conditions accordingly. The device size and design rules can reveal the applied bias range, which can be analysed by de-capping the memory chip.

The driver circuit described herein is applied to controlling a select gate on a NAND string. The circuit is also usable to drive other circuit nodes, such as for other select gate environments on low-voltage integrated circuits that require strong turn off and turn on of the select gates, where the select gate threshold voltage does not provide substantial margin when operating at the lower power supply voltages.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A device, comprising:
   a first power supply circuit configured to be connected to a first power supply to distribute a first power supply voltage;
   a second power supply circuit configured to connect to a second power supply, the second power supply circuit configured to distribute a second power supply voltage higher than the first power supply voltage;

a control circuit to generate a first control signal, having a voltage level between the first power supply voltage and a first reference voltage;

a voltage driver to drive a circuit node with a first voltage or a second voltage having voltage levels between the second power supply voltage and a second reference voltage, in response to the first control signal; and a boost circuit to boost the first control signal above the first power supply voltage level for supply to the voltage driver.

2. The device of claim 1, wherein the voltage driver includes:

first switch transistor connected between the circuit node and the second power supply circuit;

second switch transistor between the circuit node and the second voltage reference; and wherein the boost circuit is connected to a gate of the first switch transistor.

3. The device of claim 2, wherein the boost circuit includes:

a pass gate between a control signal output and a gate node connected to the gate of the first switch transistor;

a capacitor having a first terminal connected to the gate node of the first switch transistor and a second terminal; and control logic to generate a first timing signal on the gate of the pass gate to transfer the first control signal to the gate node, and a second timing signal on the second terminal of the capacitor to boost the gate node above the first supply voltage level.

4. The device of claim 2, wherein the first switch transistor is an NMOS transistor.

5. The device of claim 2, wherein the control circuit comprises a plurality of transistors configured for operation with the first supply voltage level, and the voltage driver and the boost circuit comprise transistors configured for operation with the second supply voltage.

6. The device of claim 1, wherein the control circuit comprises a plurality of transistors having a first gate dielectric thickness, and the voltage driver and the boost circuit comprise transistors having a second gate dielectric thickness greater than the first gate dielectric thickness.

7. The device of claim 1, including a charge pump circuit connected as the second power supply to the second power supply circuit.

8. The device of claim 1, wherein the first power supply circuit includes a conductor configured to be connected to an external power supply.

9. The device of claim 1, including a transistor having a first current-carrying node electrically connected to the circuit node during an operation, a gate connected to a select line during the operation, and a second current-carrying terminal connected to a memory circuit, wherein the select line has a select line voltage higher than the first supply voltage during the operation, the first voltage is higher than the first supply voltage so that the transistor is turned off to block current flow to the memory circuit during the operation, and the second voltage is lower than the first supply voltage so that the transistor is turned on to conduct current to the memory circuit during the operation.

10. A memory device, comprising:

a plurality of bit lines;

a plurality of NAND strings arranged for connection to corresponding bit lines in the plurality of bit lines, a NAND string in the plurality of NAND strings including a select gate connected to a string select line, for connection of the NAND string to the corresponding bit line;

a select gate driver connected to the string select line to supply a voltage higher than a first supply voltage;

a first power supply circuit configured to be connected to a first power supply to provide the first supply voltage;

a second power supply circuit configured to connect to a second power supply, the second power supply circuit configured to distribute a second supply voltage higher than the first power supply circuit;

a page buffer connected to the first power supply circuit to generate program/inhibit signal outputs for corresponding bit lines in the plurality of bit lines, having a voltage level between the first power supply voltage and a first reference voltage;

a plurality of data line drivers connected to the second power supply circuit and to the page buffer, to drive data line nodes coupled to corresponding bit lines with a first bit line voltage or a second bit line voltage having voltage levels between a second power supply voltage and a second reference voltage, in response to the program/inhibit signal output from the page buffer, a data line driver in the plurality of data line drivers including:

first switch transistor connected between the data line node and the second power supply circuit;

second switch transistor between the data line node and the second voltage reference; and a boost circuit receiving the program/inhibit signal to boost the gate of the first switch transistor above the first supply voltage level to turn on the first switch transistor.

11. The memory device of claim 10, wherein the boost circuit includes a pass gate between the page buffer and a gate node connected to the first switch transistor;

a capacitor having a first terminal connected to the gate node of the first switch transistor and a second terminal; and control logic to generate a first timing signal on the gate of the pass gate to transfer the program/inhibit signal to the gate node, and a second timing signal on the second terminal of the capacitor to boost the gate node above the first supply voltage level.

12. The memory device of claim 10, wherein the first switch transistor is an NMOS transistor.

13. The memory device of claim 10, wherein the page buffer comprises a plurality of transistors configured for operation with the first supply voltage level, and the first and second switch transistors and the boost circuit comprise transistors configured for operation with the second supply voltage.

14. The memory device of claim 10, wherein the page buffer comprises a plurality of transistors having a first gate dielectric thickness, and the first and second switch transistors and the boost circuit comprise transistors having a second gate dielectric thickness greater than the first gate dielectric thickness.

15. The circuit of claim 10, including a charge pump circuit connected as the second power supply to the second power supply circuit.

16. The circuit of claim 10, wherein the first power supply circuit includes a conductor configured to be connected to an external power supply.

* * * * *